United States Patent [19]

Hall et al.

[11] 4,425,502
[45] Jan. 10, 1984

[54] PYROELECTRIC DETECTOR

[75] Inventors: Raymond F. Hall, Crawley; Andrew A. Turnbull, Reigate, both of England

[73] Assignee: U.S. Philips Corporation, New York, N.Y.

[21] Appl. No.: 269,307

[22] Filed: Jun. 2, 1981

[30] Foreign Application Priority Data

Jun. 2, 1980 [GB] United Kingdom ............... 8017945

[51] Int. Cl.³ ............................................. G01J 1/00
[52] U.S. Cl. .................................... 250/338; 250/349
[58] Field of Search .............. 250/338, 339, 340, 342, 250/352, 353; 374/208, 163

[56] References Cited

U.S. PATENT DOCUMENTS

| | | | |
|---|---|---|---|
| 3,539,803 | 11/1970 | Beerman | 250/338 |
| 3,581,092 | 5/1971 | Pearsall et al. | 250/349 |
| 3,813,550 | 5/1974 | Abrams et al. | 250/338 |
| 3,839,640 | 10/1974 | Rossin | 250/353 |

OTHER PUBLICATIONS

Perner et al., "A Pyroelectric Thermal Conductivity Detector for a Miniature Gas Chromatography System," 24th Electronic Components Conference, May 1974, p. 162.

*Primary Examiner*—Janice A. Howell
*Attorney, Agent, or Firm*—Robert T. Mayer; Bernard Franzblau

[57] ABSTRACT

In order to reduce microphony due to the piezoelectric nature of a pyroelectric element (9) in a pyroelectric detector, the detector comprises one or more flexible films resiliently supporting the element (9) and two electrical connections thereto each comprising an electrically conductive layer (6,8) on the film(s). There are suitably two films with the element (9) therebetween. The films are secured to one another around the element (9) by an adhesive, thereby urging the films against the element (9) to hold it in position and maintain the electrical connections.

12 Claims, 8 Drawing Figures

PYROELECTRIC DETECTOR

The invention relates to a pyroelectric detector and to a method of making such a detector.

More specifically, one aspect of the invention relates to a pyroelectric detector comprising an element of pyroelectric material for generating electrical charges at two opposed faces of the element when the temperature of the element changes, flexible film means resiliently supporting the element, the element being substantially less flexible than the flexible film means, and a respective electrical connection to each of said faces for detecting the electrical charges, wherein the electrical connection to one face comprises an electrically conductive layer extending along and supported by the flexible film means.

Pyroelectric detectors are used for detecting infrared radiation, for example in the wavelength range of 8–14 μm. A pyroelectric detector generally comprises an element of pyroelectric material with two electrodes respectively on opposite faces of the element. When the temperature of the element changes, for example as a result of the incidence on the element of radiation from a scene being viewed, electrical charges are generated at the electrodes. If the element is arranged as a capacitor in a suitable amplifying circuit, the resultant current or the voltage developed across a suitable resistor can be detected. Since the pyroelectric charge is produced only while the temperature of the element is changing, it is necessary for the temperature to be varied continuously to obtain a continuous electrical signal. This may be done by chopping the incident radiation at a uniform frequency, the element being exposed to radiation at a reference temperature while the radiation from the scene being viewed is cut off.

Pyroelectric materials are also piezoelectric, and hence a pyroelectric detector will produce an electrical output if it is subjected to vibration which subjects the pyroelectric element to varying stress, for example if the detector is mounted on a vehicle. This phenomenon, termed microphony, constitutes undesired background noise which interferes with the detection of radiation.

The pyroelectric element in commercially available detectors is generally rigidly mounted, but it has been found that such a manner of mounting can result in an undesirably large degree of microphony. It is also known (see, for example, Applied Optics, Vol. 7, No. 8, September 1968, pp. 1687–1695) to mount a pyroelectric element on a thin plastics film with an electrically conductive layer on the film providing an electrical connection to an electrode adjacent the film. Such a manner of mounting may reduce microphony, and has the additional advantage of providing a path of only low thermal conductance from the element, thereby increasing the responsivity of the detector at low chopping frequencies. However, it has been found that the detector may still be susceptible to significant microphony. Furthermore, a lead providing an electrical connection to the electrode remote from the film may constitute a path of fairly high thermal conductance.

According to a first aspect of the invention, a pyroelectric detector as set forth in the second paragraph of this specification is characterised in that the electrical connection to the other face comprises a further electrically conductive layer extending along and supported by the flexible film means.

The element can thus be supported and electrical signals derived therefrom via the electrical connections in such a manner that the element is subject to substantially less stress and has substantially smaller thermal losses than in known detectors and furthermore is relatively isolated from vibration. The combination of the flexible film means, which support the element, and the electrical connections to both faces into what may effectively be a single mechanical integer may substantially remove a potential cause of strain that exists in known detectors where the means for supporting the element and the electrical connection to at least one of the faces are mechanically separate. In the latter case, the electrical connection may impose a substantial additional mechanical constraint on the system which comprises the element and its supporting means. The electrical connection differs from the supporting means both in position and in mechanical characteristics, and is likely to co-operate with the supporting means in exerting a stress on the element, especially when the detector is subjected to shock or vibration. In a detector embodying the invention, the flexible film means and the electrical connections can accommodate their shapes more readily to the mechanical constraints imposed by the element of pyroelectric material, which may be relatively stiff but fragile, than can known combinations of supporting means for the element and electrical connections at least one of which is independent of the element supporting means, particularly if such an independent connection is sufficiently stiff to be at least partly self-supporting (as is generally the case with a wire).

In addition, an electrically conductive layer may readily be provided with a cross-sectional area substantially less than that of a connecting wire which typically may have a diameter of 25 μm with a small element and hence the total thermal conductance between the element and its surroundings may be reduced.

The electrically conductive layers may extend from the element along, and be supported by, a common flexible film. This may simplify construction in that only a single film may be required. Said other face may be remote from the common flexible film and the electrical connection thereto may comprise another electrically conductive layer extending over another face of the element between said two opposed faces.

Preferably, the electrically conductive layers extend from the element along, and are supported by, respective flexible films. This may be a simpler and more reliable way of mounting the element is mounted between the films. The mounting of the element may then by symmetrical and the element may be protected by the films. The films may be secured to one another around the element by an adhesive. This can help to provide additional protection for the element and may be used to hold the films against said faces of the element without having to provide a bond directly between the element and a film.

An electrical connection to a face of the element may comprise a distinct electrode provided on said face by, for example, vacuum deposition. The electrically conductive layer may be on a surface of a flexible film remote from a face of the element, with the electrical connection to that face provided by capacitative coupling through the film between the layer and such an electrode on the face or the face itself.

The flexible film means may consist of a plastics material, such as a polyimide which has good mechanical strength even if very thin. The film(s) may be held tautly on a rigidly mounted ring of electrically insulating material supporting electrically conductive material constituting electrical terminals to which the layers on the films are connected and to which leads can be connected by standard wire bounding techniques. Suitably, the thickness of the film(s) is not substantially greater than 2 μm in order to provide high flexibility and low thermal conductance, and, if radiation to be detected must pass through a film, low absorption of radiation in the operating wavelength range of the detector.

According to a second aspect of the invention, a method of making a detector embodying the first aspect of the invention comprises the step of providing one or more bonds for both holding the element in position on the flexible film means and maintaining said electrical connections.

In known detectors, at least one of the electrical connections to a face of the element has generally required a bond to the element that is entirely separate from a bond holding the element in position on supporting means. The provision of this separate bond for the electrical connection has now been found to be undesirable since it is liable to produce strain in the element and to result in the detector being susceptible to significant microphony. Considering typical methods of providing such a bond, a layer of electrically conductive adhesive for securing a wire may have substantial thickness (e.g. several tens of microns) and will tend to change its dimensions as it sets, applying stress to any surface to which it is adhering. Thermo-compression or ultrasonic bonding involves the application of substantial force to the materials to be bonded, a process which is inherently liable to leave significant stress in the bonded materials. Furthermore, such a bond is liable to have significant stiffness over a substantial area, and the absence of such a bond is therefore of assistance in enabling any stress to which the flexible film means and the electrical connections are subjected in use to be taken up predominantly by elastic deformation and without a substantial proportion of the stress being applied to the element. The absence of such a bond is also of assistance in enabling the effects of differences in coefficients of thermal expansion of the pyroelectric material, the element supporting means and the electrical connections to be accommodated more readily.

The above-mentioned disadvantages can be avoided by maintaining the electrical connections to the faces of the element by virtue of the element being held in position on the flexible film means. One or more bonds for achieving this preferably have substantially the same flexibility as the flexible film means. One method of making such a bond is to secure the element to a film with a very thin layer of adhesive (for example having a thickness, when set, of about 0.1 μm) therebetween, for example by forming a very thin layer of liquid adhesive on the film by spinning, bringing the element up to the adhesive, and curing the adhesive. The film, owing to its flexibility, can readily conform closely to the surface of the element. An adhesive is not required to fill substantial gaps between the bonded surfaces (as is generally the case with a bond between two stiff materials).

An alternative method of making such a bond is the method disclosed in published U.K. Patent Application GB No. 2,031,794A, wherein a polymer film is exposed to moisture so that water is adsorbed on a surface thereof and pyroelectric material is brought towards said surface, causing mutual attraction therebetween and a permanent bond being formed when they are in contact. If the electrically conductive layers extend from the element along respective flexible films with the element therebetween, a further alternative is a method wherein one of the films is used to support the element, the other film is brought adjacent to said one film, and an adhesive is provided between the films to secure them to one another and to urge the films respectively against said faces of the element whereby to both hold the element in position on the films and to maintain said electrical connections. As this does not require a bond to be made to the element itself, it may be particularly suitable where the element is fragile and/or of small area.

An embodiment of the invention will now be described, by way of example, with reference to the accompanying diagrammatic drawings, in which.

Figure 1A:
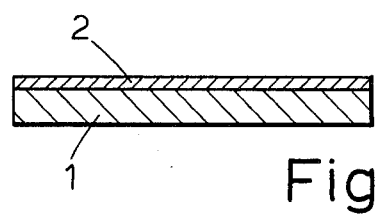
FIGS. 1a, 1b and 1c show respectively three successive stages in the preparation of a thin plastics film.
Figure 1B:
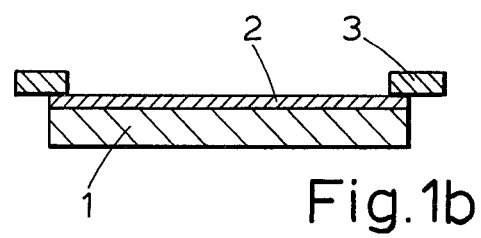
Figure 1C:
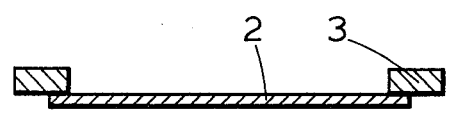

A method of making an experimental detector embodying the invention will be described with reference to the drawings. A polyimide plastics film sufficiently large to make several detectors was prepared by a method similar to that described in U.K. Specification No. 1,508,299, in this case initially on a circular glass microscope slide 1 (FIG. 1a) 40 mm in diameter and 0.1 mm thick. 3 volumes of PYRE-M.L. (Trade Mark, Du Pont Co.) wire enamel type No. R.C. 5044 were diluted with 1 volume of N-methyl-2-pyrrolidone. A small quantity of this solution was placed on the cleaned glass slide 1, which was then spun at 4000 r.p.m. for about 2 minutes, initially at ambient temperature and then under a lamp to dry the film. The film was cured by baking at about 400° C. for about an hour in oxygen-free nitrogen. The cured film 2 had a thickness of about 0.85 μm. A copper washer 3 (FIG. 1b) was stuck to the free surface of the film with Araldite (Trade Mark) epoxy resin adhesive (not shown). When the adhesive had set, the glass slide was carefully dissolved away with hydrofluoric acid, leaving the film 2 held tautly on the washer 3 (FIG. 1c).

A number of glass rings were then secured to the plastics film with adhesive. Two sizes of ring were used: the smaller had an outer diameter of 6 mm and a cross-section 1 mm square, and the larger had an inner diameter of 7 mm and an outer diameter of 10 mm. The adhesive used was again a solution of PYRE-M.L., 1 volume of wire enamel in this case being diluted with 3 volumes of solvent. The adhesive was lightly cured at about 100° C. for a quarter of an hour. The rings were then cut free from the large film around their outer peripheries, and the adhesive was cured at about 400° C. for about an hour in oxygen-free nitrogen, leaving each ring with a film held tautly thereon.

Liquid bright gold was applied to the film held on one of the smaller rings 4 at four regions located over the ring and spaced around it at angular intervals of 90°

Figure 2A:
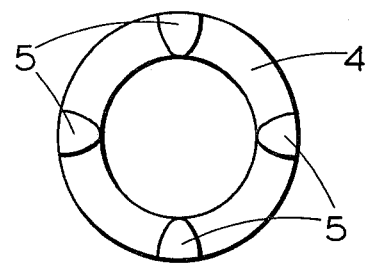
FIGS. 2a and 2b show two successive stages in the provision of gold layers on a first film supported on an electrically insulating ring.
Figure 2B:
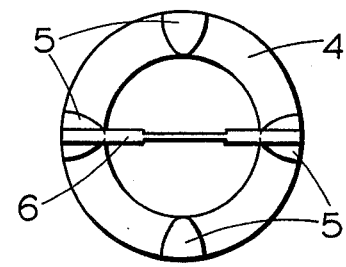
Figure 3:
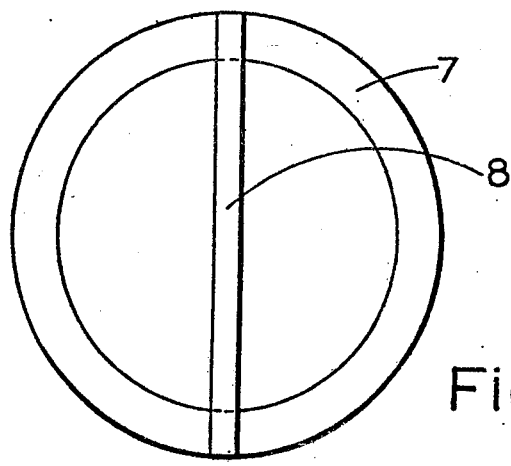
FIG. 3 shows a gold layer on a second film supported on another insulating ring.

, and to adjoining portions of the outer circumferential face of the ring. The ring was then baked in air at 420° C. for a quarter of an hour to produce gold layers a few hundred nm thick providing four electrical terminals 5 (FIG. 2a). An electrically conducting gold connecting layer 6 (FIG. 2b) some 30 nm thick was then evaporated in vacuo onto the same surface of the film as the terminal layers, i.e. the surface remote from the ring. This connecting layer extended diametrically across the film between two of the terminal layers and had a width of 100 μm except for a central portion 2 mm long which had a width of 20 μm. A diametrically extending gold connecting layer 8 (FIG. 3) was similarly evaporated onto a film held on one of the larger rings (7), this layer having a uniform width of 600 μm.

Figure 4:
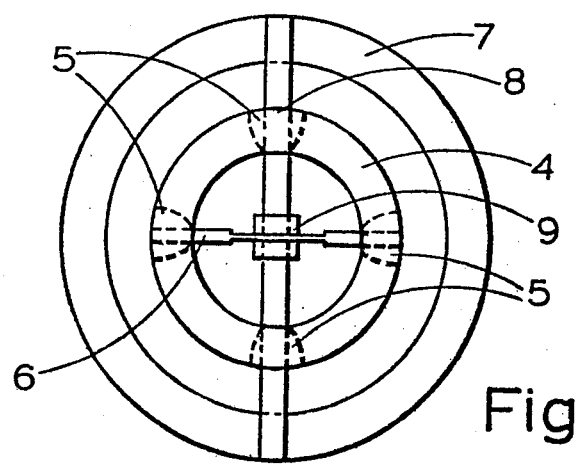
FIG. 4 is a plan view of the rings and films of FIGS. 2 and 3 combined with a pyroelectric element for the assembly of a detector.

The larger ring 7 was placed on a level surface with the film uppermost, and a pyroelectric element 9 (FIG. 4) of PLMZT (lead lanthanum manganese zirconium titanate), 1 mm square and 12 μm thick and having a sputtered nickel-chromium electrode about 30 nm thick on each major surface, was positioned centrally on the film on the gold connecting layer. The smaller ring 4 was brought up with its film lowermost and placed coaxially on the film held on the larger ring 7 so that the two contact layers 6 and 8 were orthogonal, with the pyroelectric element 9 sandwiched between the films and the contact layers. Adhesive as used for securing the glass rings to the plastics film was applied between the films at two diametrically opposite points immediately beneath the outer ends of the upper contact layer 6. It was found that the adhesive ran between the films, circumferentially beneath the upper ring 4 and inwards towards the pyroelectric element. Although the films had not previously been in contact except circumferentially beneath the upper ring, the surface tension of the liquid adhesive tended to pull them together, but did not prevent contact between the connecting layer 8 on the lower film and two of the gold terminal layers 5 on the upper film adjacent that connecting layer. As the adhesive ran inwards, it left a pocket of air around the pyroelectric element 9 that prevented the adhesive reaching the element and that also tended to cause some bulging of the films. Excess air from the pocket permeated out over a period of a few hours, and the setting adhesive pulled the films together and urged the connecting layers 6 and 8 thereon into good electrical contact with the electrodes on the element. When the adhesive had set, it was cured at about 400° C. for about an hour in oxygen-free nitrogen. The films were then freed from the larger ring by cutting around the outer periphery of the smaller ring, leaving the films attached to the smaller ring 4 with the pyroelectric element supported by and between the films and mechanically relatively isolated from the ring 4. In use, the ring 4 suitably is rigidly mounted.

Figure 5:
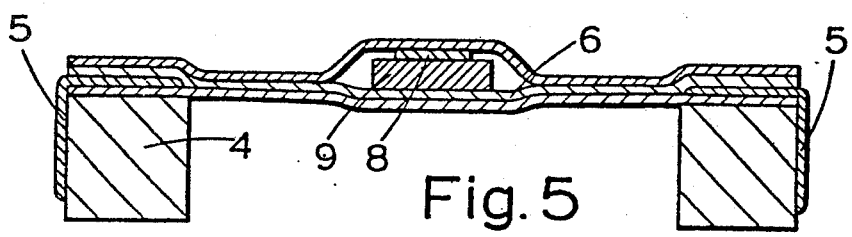
FIG. 5 is a cross-sectional view of the assembled detector.

The detector thus formed is adapted for the detection of infrared radiation that is incident on the plastics film which is the lower of the two films in FIG. 5, i.e. the film supporting the connecting layer 6 having a central portion of reduced width to absorb less of the incident radiation before it reaches the pyroelectric element. Blackening may be used to improve absorption of radiation by the element. It has been found that the described plastic film transmits approximately 80% of the incident radiation in the wavelength range of 8-14 μm. To increase the proportion of radiation reaching the pyroelectric element, a hole could be cut centrally in one film so that the element engages the film only around the edges of the element.

It is of course not necessary for the connecting layers 6 and 8 to extend across the films between a respective pair of terminal layers 5. Two single terminals associated with respective connecting layers each providing a single electrical connection to a respective one of the electrodes on the pyroelectric element 9 will suffice. On the experimental detector described above, the pairs of terminals were used to check the electrical resistance and continuity of each connecting layer. The connecting layers can be differently dimensioned in other respects, for example, they may be narrower.

The microphony of the experimental detector was compared with that of a commercial device, in which the pyroelectric element is mounted in a conventional, rigid manner, by subjecting each to vibration at 100 Hz from an electric motor and determining the increase in background noise in a 10 Hz bandwidth. Whereas the vibration caused a 20-fold increase in noise from the commercial device, it caused an increase of only 20% in the noise from the experimental device with the element resiliently mounted. Mechanical impulse tests showed that whereas the conventional detector had a substantial response over a broad range of frequencies, a detector embodying the invention exhibited only two minor resonances at frequencies of about 400 Hz and 600 Hz respectively, so that the reduction in microphony would therefore be particularly large if the detector is operated in a frequency range not including either of the resonances.

Further advantages of the above-described mounting of the pyroelectric element are that it allows the use of very thin elements without serious risk of breakage, thus enabling electrical noise from the element to be reduced, and that the films provide a form of protective encapsulation.

The thermal conductance of the mounting in the described detector enables the detector to be used to detect low levels of radiation at chopping frequencies down to less than 10 Hz.

As an alternative to the above-described arrangement comprising two flexible films each supporting a respective electrically conductive layer, a detector embodying the first aspect of the invention may comprise one flexible film supporting two electrically conductive layers. As an example of such an embodiment, the layers may be collinear and separated by a small gap. The element may be arranged so as to bridge the gap, with an electrode which covers most of a first of two opposed major surfaces of the element being in contact with a first of the two conductive layers on the film and with an electrode on the second major surface of the element being connected to the second conductive layer on the film by another electrically conductive layer which extends over another face of the element between the two opposed major surfaces. Preferably, this last layer is provided on the element before the element is mounted on the film, and extends onto the first major surface of the element. It may be provided by vacuum-deposition simultaneously and integrally with the second electrode. The element may be bonded to the film by adhesive or by the method disclosed in the above-mentioned published U.K. Patent Application GB No. 2,031,749A.

The low thermal conductance ($G_T$) between the element and its surroundings that may readily be achieved in embodiments of the invention is also advantageous in reducing the Noise Equivalent Power (NEP) of the detector, in that the contribution to NEP from the thermal conductance is $(4kT^2G_T)^{\frac{1}{2}}$, where k is Boltzmann's constant and T is absolute temperature. Furthermore, a low value of $G_T$ reduces NEP by virtue of increasing the responsivity of the detector, especially at low frequencies. The consequent low value of this contribution may be of particular importance for a detector element of small area.

As well as the single-element detectors described above, the invention may also be applied to linear and 2-dimensional arrays of detector elements, the elements being supported on flexible film means common to all the elements. In, for example, a linear array, one electrically conductive layer can provide a common first electrical connection to all the elements, and a plurality of further electrically conductive layers can provide respective second electrical connections to the elements.

We claim:

1. A pyroelectric detector comprising an element of pyroelectric material for generating electrical charges at two opposed faces of the element when the temperature of the element changes, flexible film means resiliently supporting the element, the element being substantially less flexible than the flexible film means, and a respective electrical connection to each of said faces for detecting the electrical charges with the electrical connection to one face comprising an electrically conductive layer extending along and flexibly supported by the flexible film means, and the electrical connection to the other face comprising a further electrically conductive layer extending along and flexibly supported by the flexible film means.

2. A detector as claimed in claim 1 wherein the flexible film means comprise a common flexible film and the electrically conductive layers extend from the element along, and are supported by, said common flexible film.

3. A detector as claimed in claim 2 wherein said other face is remote from the common flexible film and the electrical connection therefrom comprises another electrically conductive layer extending over another face of the element between said two opposed faces.

4. A detector as claimed in claim 1 wherein the flexible film means comprise first and second flexible films so that the electrically conductive layers extend from the element along, and are supported by, respective ones of said first and second flexible films.

5. A detector as claimed in claim 4 wherein the element is mounted between the films.

6. A detector as claimed in claim 4 or 5 wherein the films are secured to one another around the element by an adhesive.

7. A detector as claimed in claim 1 wherein said flexible film means comprises a single flexible film supporting said electrically conductive layer and said further electrically conductive layer on one surface of the flexible film and separated from one another by a small gap, said element being mounted to bridge said gap and having a first electrode covering a part of a first of said two opposed faces so as to contact said electrically conductive layer, said element having a second electrode on a second of said two opposed faces and which electrode extends over an edge of said element to cover a second part of said first face of the element so that it contacts said further electrically conductive layer on the flexible film.

8. A pyroelectric detector comprising an element of pyroelectric material responsive to temperature and having two electrodes respectively on opposite faces thereof, first and second flexible films with each film supporting a respective electrically conductive layer for providing an electrical connection to a respective one of the element electrodes, said element being mounted between the films and being resiliently supported by at least one of the films, said element being mounted between the flexible films by bringing the other film adjacent to said one film, and providing an adhesive between the films to secure them to one another and to urge the electrically conductive layers against a respective electrode on the element.

9. A pyroelectric detector comprising an element of pyroelectric material that is responsive to temperature, first and second flexible films supporting first and second electrically conductive strips, respectively, said element being mounted between said first and second flexible films and being resiliently supported by at least one of the films, said first and second films being secured to one another around said element in a manner that urges the films against opposite first and second faces of the element and simultaneously provides electrical connections between said first and second faces of the element and said first and second electrically conductive strips, respectively.

10. A detector as claimed in claim 9 wherein said element is much less flexible than said one of the films, said first and second films being secured to one another by means of an adhesive, and further comprising a rigidly mounted ring of electrically insulating material to which said films are tautly secured.

11. A detector as claimed in claim 10 wherein said first and second conductive strips are orthogonal to one another and are located in parallel planes.

12. An array of pyroelectric detectors with each detector comprising an element of pyroelectric material for generating electrical charges at two opposed faces of the element when the temperature of the element changes, the array comprising flexible film means common to and resiliently supporting all of the elements, each element being substantially less flexible than the flexible film means, electrical connections to each of said faces of each element for detecting the electrical charges with the electrical connection to one face of each element comprising an electrically conductive layer extending along and flexibly supported by the flexible film means, and the electrical connection to the other face of each element comprising a further electrically conductive layer extending along and flexibly supported by the flexible film means.

* * * * *